United States Patent
Ando

(10) Patent No.: US 6,429,467 B1
(45) Date of Patent: Aug. 6, 2002

(54) HETEROJUNCTION FIELD EFFECT TRANSISTOR

(75) Inventor: Yuji Ando, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/492,611

(22) Filed: Jan. 27, 2000

(30) Foreign Application Priority Data

Jan. 29, 1999 (JP) ............................................. 11-022516

(51) Int. Cl.⁷ .............................................. H01L 29/778
(52) U.S. Cl. ......................................... 257/194; 257/22
(58) Field of Search ................................... 257/194, 22

(56) References Cited

U.S. PATENT DOCUMENTS

| 4,695,857 A | * | 9/1987 | Baba | 257/22 |
| 4,914,488 A | * | 4/1990 | Yamane | 257/22 |
| 6,064,082 A | * | 5/2000 | Kawai | 257/192 |
| 6,177,685 B1 | * | 1/2001 | Teraguchi | 257/192 |

FOREIGN PATENT DOCUMENTS

| JP | 9-51091 | 2/1997 |
| JP | 9-307097 | 11/1997 |
| JP | 10-41230 | 2/1998 |
| JP | 10-173203 | 6/1998 |
| JP | 10-223901 | 8/1998 |
| JP | 10-294452 | 11/1998 |
| JP | 11-261053 | 9/1999 |
| JP | 11-297713 | 10/1999 |

OTHER PUBLICATIONS

Wu et al, *IEEE Elect. Dev. Lett.* vol. 19 No. 2 "High Al–Content AlGa N/Ga N . . . Performance" pp. 50–53.*
Wu et al, *IEEE Elec. Dev. Lett.* vol. 18 No. 9 Short Channel ALGaN/GaN Modfet's . . . 10 GHz pp. 438–440 Sep. 1997.*

* cited by examiner

Primary Examiner—Jerome Jackson, Jr.
(74) Attorney, Agent, or Firm—Hutchins, Wheeler & Dittmar

(57) ABSTRACT

A heterojunction field effect transistor has a buffer layer, a channel layer, a gate insulating layer, a source electrode, a drain electrode, and a gate electrode to be in contact with a substrate. The buffer layer has at least one GaN layer. The channel layer has a composition of $In_zGa_{1-z}N$ ($0 \leq z < 1$) and the gate insulating layer is an InAlGaN layer. The source and drain electrodes are in ohmic contact with the channel layer and the gate electrode and the gate insulating layer are in Schottky contact with each other.

18 Claims, 4 Drawing Sheets

HETEROJUNCTION FIELD EFFECT TRANSISTOR

BACKGROUND OF THE INVENTION

1. Field of the Invention

The present invention relates to a heterojunction field effect transistor (to be abbreviated as HJFET hereinafter) and, more particularly, an HJFET having good controllability for a threshold voltage.

2. Description of the Prior Art

FIG. 1A is a view showing the element structure of an HJFET according to the prior art. This HJFET is reported in, e.g., U. K. Mishra et al, IEEE Transactions on Microwave Theory and Techniques, Vol. 46, page 756, 1998.

Referring to FIG. 1A, a buffer layer 91 comprised of a multilayered structure of aluminum nitride (AlN) and gallium nitride (GaN) is formed in contact with a sapphire ($Al_2O_3$) substrate 90, and a channel layer 92 made of gallium nitride (GaN) is formed in contact with the buffer layer 91. A gate insulating layer 93 made of undoped AlGaN is formed in contact with the GaN channel layer 92. Two-dimensional electrons 94 are generated in the channel layer 92 to establish ohmic contact between a source electrode 97S formed on the gate insulating layer 93 and a drain electrode 97D, and the channel layer 92. A gate electrode 99 is formed between the source electrode 97S and drain electrode 97D to establish Schottky contact with the gate insulating layer 93.

FIG. 1B is a schematic diagram of conduction band energy between the gate electrode 99 and GaN channel layer 92 of the prior art HJFET. The lattice constant (a-axis) of AlGaN forming the gate insulating layer 93 is shorter than that of GaN forming the buffer layer 91. Hence, a piezoelectric field is formed to extend from the substrate toward the surface. Even when the gate voltage is 0 V, the two-dimensional electrons 94 are generated in the channel layer 92. Therefore, in the prior art HJFET, the threshold voltage is difficult to control, and the prior art HJFET usually forms a depletion type FET. An enhancement type FET is thus difficult to fabricate.

SUMMARY OF THE INVENTION

The present invention has been made to solve the above problems of the prior art, and has as its object to provide an HJFET structure that can form a depletion type FET and an enhancement type FET separately by improving the controllability for the threshold voltage.

In order to achieve the above object, according to the main aspect of the present invention, there is provided a heterojunction field effect transistor having a buffer layer including at least one GaN layer, a channel layer, a gate insulating layer, a source electrode, a drain electrode, and a gate electrode on a substrate, wherein the channel layer has a composition of $In_zGa_{1-z}N$ ($0 \leq z < 1$) and the gate insulating layer is an InAlGaN layer, and the source and drain electrodes are in ohmic contact with the channel layer and the gate electrode and the gate insulating layer are in Schottky contact with each other.

In the prior art, the threshold voltage is difficult to control due to the following reason. Namely, the lattice constant (a-axis) of AlGaN forming the gate insulating layer is shorter than that of GaN forming the buffer layer. Hence, two-dimensional electrons are generated in the channel layer due to a piezoelectric effect. To enable fabrication of a depletion type FET and an enhancement type FET separately by improving the controllability for the threshold voltage, the gate insulating layer may be made of a material the d-axis length of which can be changed around the lattice constant (a-axis) of GaN. This can be realized by setting, in $In_xAl_yGa_{1-x-y}N$ as a four-element type semiconductor, the composition ratio of x to y appropriately.

In the present invention, in an HJFET having a GaN buffer layer and an $In_zGa_{1-z}N$ channel layer ($0 \leq z < 1$), $In_xAl_yGa_{1-x-y}N$ ($x>0$, $y>0$, $x+y \leq 1$) is used to form a gate insulating layer.

Even if $In_zGa_{1-z}N$ ($z \neq 0$) is used to form the channel layer, a good crystal free from crystal dislocation is formed at a small film thickness because of the effect of the strain layer. In this case, it is already known that the a-axis length of the $In_zGa_{1-z}N$ ($z \neq 0$) layer is equal to that of the GaN buffer layer. The thickness of the channel layer satisfying this condition is 300 Å or less and preferably 30 Å to 200 Å for z=0.1, and is 100 Å or less and preferably 30 Å to 80 Å for z=0.2.

The a-axis length of $In_xAl_yGa_{1-x-y}N$ is expressed as:

$$a(x, y) = 3.548x + 3.112y + 3.189(1-x-y) \text{ Å} \quad (1)$$

The condition under which the a-axis length of $In_xAl_yGa_{1-x-y}N$ becomes smaller than that of the GaN buffer layer (a=3.189 Å) is: $a(x, y) < 3.189$ Å. Hence, $$y > 4.66x \quad (2)$$

At this time, a piezoelectric field is formed to extend from the substrate toward the surface, in the same manner as in the prior art, and accordingly a depletion type FET becomes easy to fabricate.

The condition under which the a-axis length of $In_xAl_yGa_{1-x-y}N$ becomes larger than that of the GaN buffer layer is: $a(x, y) > 3.189$ Å. Hence, $$y < 4.66x \quad (3)$$

At this time, a piezoelectric field is formed to extend from the surface toward the substrate, unlike in the prior art. Hence, when the gate voltage is 0 V, the channel layer is depleted, and an enhancement type FET becomes easy to fabricate.

Preferably, the difference in the a-axis length between $In_xAl_yGa_{1-x-y}N$ forming the gate insulating layer and GaN forming the buffer layer can be set to be equal to the difference in a-axis length between AlN (a=3.112 Å) and GaN (a=3.189 Å) or less. Then, a critical thickness with which crystal dislocation occurs increases, so that controllability for the threshold voltage is improved. The condition under which the difference in the a-axis length between $In_xAl_yGa_{1-x-y}N$ and GaN becomes smaller than the difference in a-axis length between AlN and GaN is $|a(x, y) - 3.189| < 3.189 - 3.112$ Å. Hence, $$|y - 4.66x| < 1 \quad (4)$$

More preferably, the a-axis length of $In_xAl_yGa_{1-x-y}N$ becomes equal to that of the GaN buffer layer. The condition for this is: $a(x, y) = 3.189$ Å. Accordingly, $y=4.66x$ can be obtained. Since crystal dislocation does not occur in this case, the thickness of the gate insulating layer can become arbitrary, so that controllability for the threshold voltage is improved greatly. More practically, assuming that an error within the range of −5% to +5% is allowed as a deviation of the ratio of mixed crystal from the lattice matching condition, this condition is expressed as:

$|y-4.66x|<0.05$ (5)

To make this gate insulating layer serve as a good gate insulating layer having a small leakage current, its band gap must be larger than that of $In_zGa_{1-z}N$ forming the channel layer. The band gap of $In_xAl_yGa_{1-x-y}N$ is expressed as:

$Eg(x, y)=1.89x+6.2y+3.39(1-x-y)[eV]$ (6)

Meanwhile, the band gap of $In_zGa_{1-z}N$ is expressed as:

$Eg(z)=1.89z+3.39(1-z)[eV]$ (7)

Accordingly, the condition under which the band gap of $In_xAl_yGa_{1-x-y}N$ becomes larger than that of $In_zGa_{1-z}N$ is $Eg(x, y)>Eg(z)$. This yields the following inequality:

$y>0.533(x-z)$ (8)

The object of the present invention can also be realized by using, as the gate insulating layer, a three-element type semiconductor superlattice such as $In_TGa_{1-T}N/Al_SGa_{1-S}N$, $In_{1-T}Ga_TN/In_{1-S}Al_SN$, $In_TAl_{1-T}N/Al_{1-S}Ga_SN$, or the like. In that case, the three-element type superlattice is equivalent to a four-element type semiconductor having an average composition weighted by the total thickness of each layer.

For example, an $In_TGa_{1-T}N/Al_SGa_{1-S}N$ superlattice, the total layer thickness of the $In_TGa_{1-T}N$ portion of which is eÅ and the total layer thickness of the $Al_SGa_{1-S}N$ portion of which is fÅ, has an a-axis length and band gap that are substantially equivalent to those of $In_{eT/(e-f)}Al_{fS/(e+f)}Ga_{(e(1-T)+f(1-S))/(e+f)}N$.

Similarly, an $In_{1-T}Ga_TN/In_{1-S}Al_SN$ superlattice, the total layer thickness of the $In_{1-T}Ga_TN$ portion of which is eÅ and the total layer thickness of the $In_{1-S}Al_SN$ portion of which is fÅ, has an a-axis length and band gap that are substantially equivalent to those of $In_{(e(1-T)+f(1-S))/(e+f)}Al_{fS/(e+f)}Ga_{eT/(e+f)}N$, and an $In_TAl_{1-T}N/Al_{1-S}Ga_SN$ superlattice, the total layer thickness of the $In_TAl_{1-T}N$ portion of which is eÅ and the total layer thickness of the $Al_{1-S}Ga_SN$ portion of which is fÅ, has an a-axis length and band gap that are substantially equivalent to those of $In_{eT/(e+f)}Al_{(e(1-T)+f(1-S))/(e+f)}Ga_{fS/(e+f)}N$.

Therefore, the above discussion made concerning $In_xAl_yGa_{1-x-y}N$ applies to a three-element type semiconductor superlattice as well.

To form the substrate used in the present invention, for example, silicon (Si), gallium arsenide (GaAs) or the like is used, and $Al_2O_3$ or silicon carbide (SiC) is particularly preferable.

As is apparent from the above description, according to the present invention, the a-axis length of the gate insulating film $In_xAl_yGa_{1-x-y}N$ (x>0, y>0, x+y≦1) can be made larger or smaller than that of GaN by changing the mixed crystal ratio of x to y. As a result, an enhancement type FET and a depletion type FET can be made separately. Moreover, the gate insulating film can be lattice-matched with GaN, so that the degree of freedom of the thickness of the gate insulating layer is improved and controllability for the threshold voltage is greatly improved, thereby largely contributing to an improvement in performance of the HJFET.

The above and many other objects, features and advantages of the present invention will become manifest to those skilled in the art upon making reference to the following detailed description and accompanying drawings in which preferred embodiments incorporating the principles of the present invention are shown by way of illustrative examples.

DETAILED DESCRIPTION OF THE PREFERRED EMBODIMENTS

Several preferred embodiments of the present invention will be described with reference to the accompanying drawings.

First Embodiment

Figure 1A:
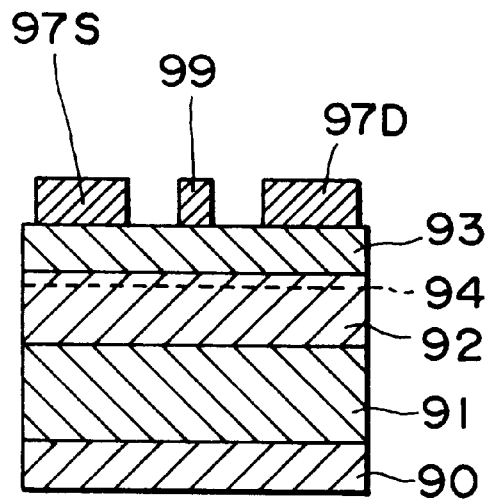
FIG. 1A is a sectional view showing a structure concerning an example of a conventional HJFET.
Figure 1B:
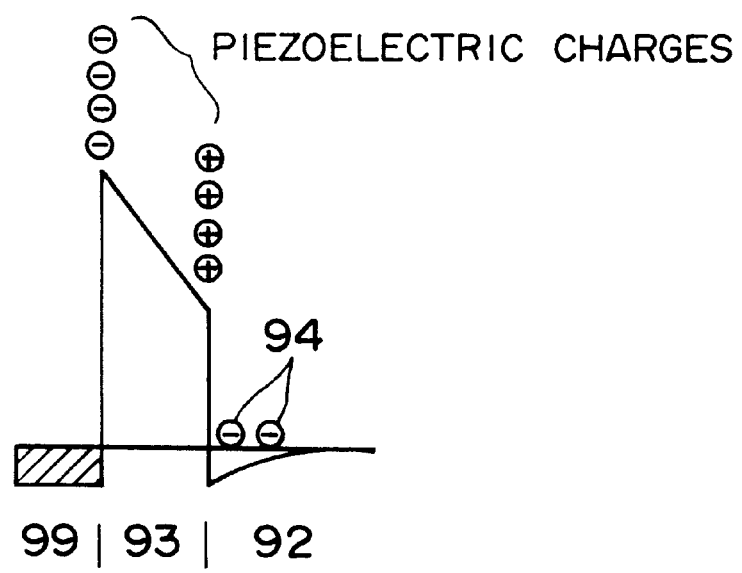
FIG. 1B is a conduction band energy diagram of the same.
Figure 2A:
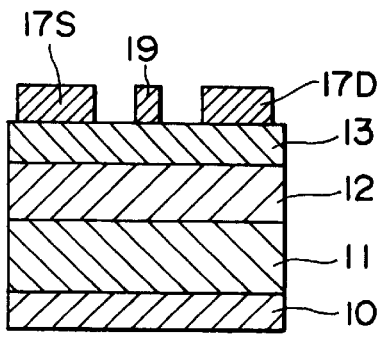
FIG. 2A is a sectional view showing a structure concerning an HJFET according to the, first embodiment of the present invention.

FIG. 2A is a sectional view showing the structure of an HJFET according to the first embodiment of the present invention. In this HJFET, a buffer layer 11 comprised of an undoped AlN layer and an undoped GaN layer is formed in contact with an $Al_2O_3$ substrate 10, and an n-type GaN channel layer 12 is formed in contact with the buffer layer 11. An undoped $In_{0.2}Al_{0.3}Ga_{0.5}N$ gate insulating layer 13 made of a four-element type semiconductor is formed in contact with the channel layer 12. A source electrode 17S and a drain electrode 17D are formed in contact with the InAlGaN gate insulating layer 13 to be in ohmic contact with it. A gate electrode 19 is formed on the InAlGaN gate insulating layer 13 to be in Schottky contact with it.

This HJFET is fabricated in the following manner. The following layers are sequentially grown on the $Al_2O_3$ substrate 10 in accordance with, e.g., metal organic chemical vapor deposition (to be abbreviated as MOCVD hereinafter), in the following order to have the following thicknesses:

1) undoped AlN layer 11a . . . 100 nm
2) undoped GaN layer 11b . . . 1 μm
3) n-type GaN layer ($5 \times 10^{17}$ cm$^{-3}$) 12 . . . 50 nm
4) undoped $In_{0.2}Al_{0.3}Ga_{0.5}N$ layer 13 . . . 30 nm Subsequently, a metal structure such as Ti/Al/Ni/Au is formed on the undoped InAlGaN gate insulating layer 13 by vapor deposition and alloyed at a temperature of about 900° C. to form the source electrode 17S and drain electrode 17D to be in ohmic contact with the channel layer 12. Finally, a metal structure such as Ni/Au is formed on the undoped InAlGaN gate insulating layer 13 by vapor deposition to form the gate electrode 19 to be in Schottky contact with the undoped InAlGaN gate insulating layer 13. The HJFET according to the first embodiment is fabricated in this manner.

Figure 2B:
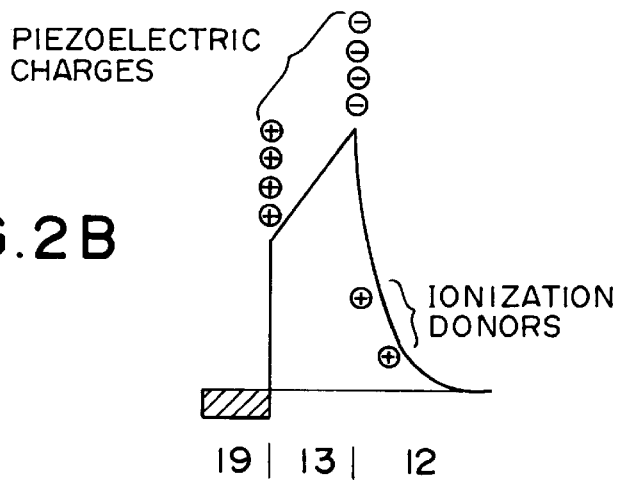
FIG. 2B is a conduction band energy diagram of the same.

FIG. 2B is a schematic view of the conduction band energy between the gate electrode 19 and channel layer 12 of this HJFET. The a-axis length of $In_{0.2}Al_{0.3}Ga_{0.5}N$ forming the gate insulating layer 13 is 3.24 Å, which is larger than that (3.19 Å) of GaN forming the buffer layer 11. Hence, a piezoelectric field is generated to extend from the surface toward the substrate. Accordingly, when the gate voltage is 0 V, the channel layer 12 is depleted to form an enhancement type FET. Since $In_{0.2}Al_{0.3}Ga_{0.5}N$ has a band gap of 3.93 eV which is larger than that (3.39 eV) of GaN, it forms a good gate insulating layer. These characteristics are apparent also since inequalities (3), (4), and (8) are established when x=0.2, y=0.3, and z=0.

Second Embodiment

Figure 3A:
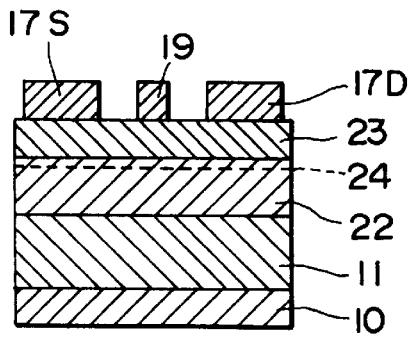
FIG. 3A is a sectional view showing a structure concerning an HJFET according to the second embodiment of the present invention.

FIG. 3A is a sectional view showing a structure according to the second embodiment of the present invention. This HJFET structure is different from that of the first embodiment in that it uses undoped GaN and n-type $In_{0.1}Al_{0.7}Ga_{0.2}N$ to respectively form a channel electrode 22 and a gate insulating layer 23.

Figure 3B:
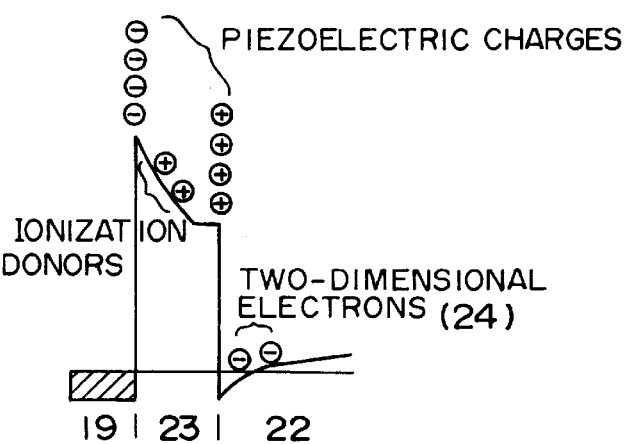
FIG. 3B is a conduction band energy diagram of the same.

FIG. 3B is a schematic view of the conduction band energy between a gate electrode 19 and channel layer 22 of this HJFET. The a-axis length of $In_{0.1}Al_{0.7}Ga_{0.2}N$ forming the gate insulating layer 23 (electron donor layer) is 3.17 Å, which is smaller than that (3.19 Å) of GaN forming a buffer layer 11. Hence, a piezoelectric field is generated to extend from the substrate toward the surface. Accordingly, when the gate voltage is 0 V, two-dimensional electrons 24 are generated in the channel layer 22 to form a depletion type FET. Since $In_{0.1}Al_{0.7}Ga_{0.2}N$ has a band gap of 5.21 eV which is larger than that (3.39 eV) of GaN, it forms a good gate insulating layer. These characteristics are apparent also since inequalities (2), (4), and (8) are established when x=0.1, y=0.7, and z=0.

In the second embodiment, the channel layer and the gate insulating layer are respectively formed of undoped GaN and n-type InAlGaN. Since the impurity concentration in the channel layer through which the electrons travel is low, the electron mobility is increased to have better high-frequency characteristics than those of the first embodiment.

Third Embodiment

Figure 4:
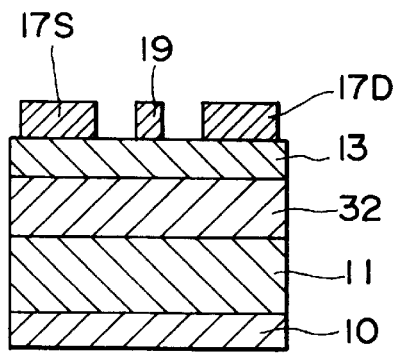
FIG. 4 is a sectional view showing a structure concerning an HJFET according to the third embodiment of the present invention.

FIG. 4 is a sectional view showing a structure according to the third embodiment of the present invention. This HJFET structure is different from that of the first embodiment in that it uses 50 Å thick n-type $In_{0.2}Ga_{0.8}N$ to form a channel layer 32. Since the channel layer is sufficiently thin, its a-axis length is equal to that of the buffer layer. Hence, the lattice matching between the channel layer and the gate insulating layer need not be considered.

The a-axis length of $In_{0.2}Al_{0.3}Ga_{0.5}N$ forming a gate insulating layer 13 is 3.24 Å, which is larger than that (3.19 Å) of GaN forming a buffer layer 11. Hence, an enhancement type FET is formed on the basis of the same principle as that of the first embodiment. Since $In_{0.2}Al_{0.3}Ga_{0.5}N$ has a band gap of 3.93 eV which is larger than that (3.09 eV) of $In_{0.2}Ga_{0.8}N$ forming the channel layer, it forms a good gate insulating layer. These characteristics are apparent also since inequalities (3), (4), and (8) are established when x=0.2, y=0.3, and z=0.2.

In the third embodiment, since the channel layer (50 Å) is formed of n-type $In_{0.2}Ga_{0.8}N$, the effective electron mass in the channel layer through which the electrons travel is decreased, and the electron mobility is increased to have better high-frequency characteristics than those of the first embodiment.

Figure 5:
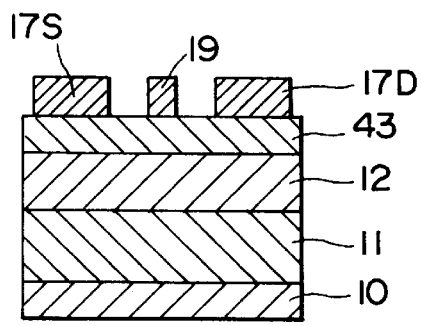
FIG. 5 is a sectional view showing a structure concerning an HJFET according to the fourth embodiment of the present invention.

Fourth Embodiment:

FIG. 5 is a sectional view showing a structure according to the fourth embodiment of the present invention. This HJFET structure is different from that of the first embodiment in that it uses, as a gate insulating layer 43, a superlattice layer obtained by stacking a 20 Å thick undoped $In_{0.4}Ga_{0.6}N$ layer and a 20 Å thick $Al_{0.6}Ga_{0.4}N$ layer seven times.

The $In_{0.4}Ga_{0.6}N/Al_{0.6}Ga_{0.4}N$ superlattice layer forming the gate insulating layer operates substantially in the same manner as four-element mixed crystal type $In_{0.2}Al_{0.3}Ga_{0.5}N$. Therefore, an enhancement type FET can be obtained on the basis of the same principle as that of the first embodiment.

In the fourth embodiment, the gate insulating layer is formed of the undoped InGaN/AlGaN superlattice layer. Since the gate insulating layer can be formed of a three-element type semiconductor material, a high-quality epitaxial layer can be formed more easily than in the first embodiment using a four-element type semiconductor material the mixed crystal ratio of which is difficult to control.

In the fourth embodiment, an InGaN/AlGaN superlattice structure is used in place of an InAlGaN layer. The same function as that of the fourth embodiment can also be realized by using a superlattice structure having another combination, e.g., an InGaN/InAlN superlattice structure or InAlN/AlGaN superlattice structure.

Fifth Embodiment

Figure 6A:
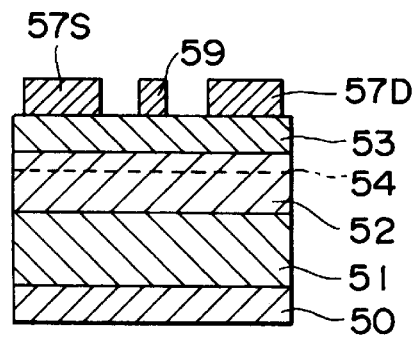
FIG. 6A is a sectional view showing a structure concerning an HJFET according to the fifth embodiment of the present invention.

FIG. 6A is a sectional view showing the structure of an HJFET according to the fifth embodiment of the present invention. This HJFET structure uses SiC to form a substrate 50, a multilayered film comprised of an undoped AlN layer and an undoped GaN layer as a buffer layer 51 which is in contact with the substrate 50, n-type GaN to form a channel layer 52 which is in contact with the buffer layer 51, and undoped $In_{0.1}Al_{0.47}Ga_{0.43}$ to form a gate insulating layer 53 which is in contact with the channel layer 52. A source electrode 57S and a drain electrode 57D are formed in contact with the InAlGaN gate insulating layer 53 to be in ohmic contact with it. A gate electrode 59 is formed on the InAlGaN gate insulating layer 53 to be in Schottky contact with it.

This HJFET is fabricated in the following manner. The following layers are sequentially grown on the SiC substrate 50 in accordance with, e.g., molecular beam epitaxy (to be abbreviated as MBE hereinafter), in the following order to have the following thicknesses:

1) undoped AlN layer 51a . . . 100 nm
2) undoped GaN layer 51b . . . 1 μm
3) n-type GaN layer ($5 \times 10^{17}$ cm$^{-3}$)52 . . . 100 nm
4) undoped $In_{0.1}Al_{0.47}Ga_{0.43}N$ layer 53 40 nm Subsequently, a metal structure such as Ti/Al/Ni/Au is formed on the undoped InAlGaN gate insulating layer 53 by vapor deposition and alloyed at a temperature of about 900° C. to form the source electrode 57S and drain electrode 57D to be in ohmic contact with the channel layer 52. Finally, a metal structure such as Ni/Au is formed on the undoped InAlGaN gate insulating layer 53 by vapor deposition to form the gate electrode 59 to be in Schottky contact with the undoped InAlGaN gate insulating layer 53. The HJFET according to the fifth embodiment is fabricated in this manner.

Figure 6B:
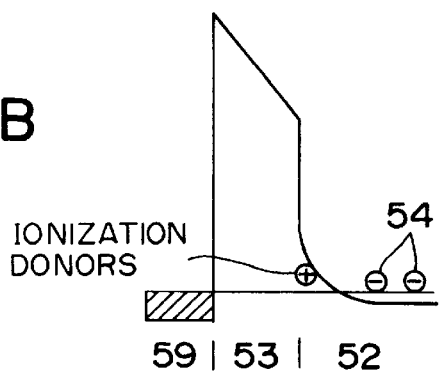
FIG. 6B is a conduction band energy diagram of the same.

FIG. 6B is a schematic view of the conduction band energy between the gate electrode 59 and channel layer 52 of this HJFET. The a-axis length of $In_{0.1}Al_{0.47}Ga_{0.43}N$ forming the gate insulating layer 53 is 3.19 Å, which is equivalent to that (3.19 Å) of GaN forming the buffer layer 51. Therefore, a good crystal free from lattice distortion can be obtained. Limitations on the thickness of the gate insulating film are accordingly eliminated, and controllability for the threshold voltage is improved. Since $In_{0.1}Al_{0.47}Ga_{0.43}N$ has a band gap of 4.56 eV which is larger than that (3.39 eV) of GaN forming the channel layer 52, it forms a good gate insulating layer. These characteristics are apparent also since inequalities (5) and (8) are established when x=0.1, y=0.47, and z=0.

Sixth Embodiment

Figure 7A:
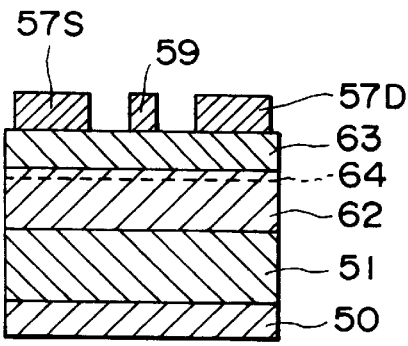
FIG. 7A is a sectional view showing a structure concerning an HJFET according to the sixth embodiment of the present invention.

FIG. 7A is a sectional view showing the structure of an HJFET according to the sixth embodiment of the present invention. This HJFET is different from that of the fifth embodiment in that its channel layer 62 uses undoped GaN and that its gate insulating layer 63 uses n-type $In_{0.05}Al_{0.23}Ga_{0.72}N$.

Figure 7B:
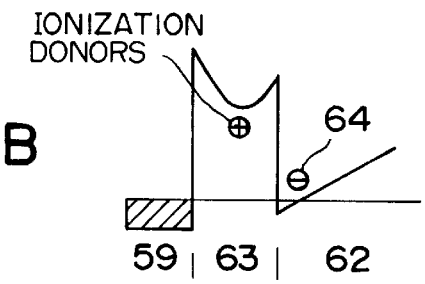
FIG. 7B is a conduction band energy diagram of the same.

FIG. 7B is a schematic view of the conduction band energy between a gate electrode 59 and the channel layer 62 of this HJFET. The a-axis length of $In_{0.05}Al_{0.23}Ga_{0.72}N$ forming the gate insulating layer 63 is 3.19 Å, which is equivalent to that (3.19 Å) of GaN forming a buffer layer 51 and the channel layer 62. Therefore, a good crystal free from lattice distortion can be obtained. Limitations on the thickness of the gate insulating film are accordingly eliminated, and controllability for the threshold voltage is improved. Since $In_{0.05}Al_{0.23}Ga_{0.72}N$ has a band gap of 3.96 eV which is larger than that (3.39 eV) of GaN forming the channel layer 62, it forms a good gate insulating layer. These characteristics are apparent also since inequalities (5) and (8) are established when x=0.05, y=0.23, and z=0.

In the sixth embodiment, the channel layer is formed of undoped GaN and the gate insulating layer is formed of n-type InAlGaN. Since the impurity concentration in the channel layer through which electrons travel is low, the electron mobility is increased to have better high-frequency characteristics than those of the fifth embodiment.

Seventh Embodiment

Figure 8:
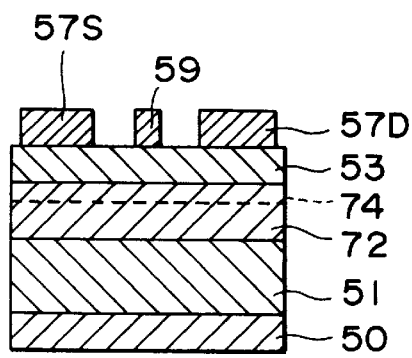
FIG. 8 is a sectional view showing a structure concerning an HJFET according to the seventh embodiment of the present invention.

FIG. 8 is a sectional view showing a structure according to the seventh embodiment of the present invention. This HJFET structure is different from that of the fifth embodiment in that its channel layer 72 is formed of 50 Å thick $In_{0.2}Ga_{0.8}N$.

Since the channel layer is sufficiently thin, its a-axis length is equal to that of the buffer layer. Hence, the lattice matching between the channel layer and the gate insulating layer need not be considered.

The a-axis length of $In_{0.1}Al_{0.47}Ga_{0.43}N$ forming a gate insulating layer 53 is 3.19 Å, which is equal to that (3.19 Å) of GaN forming a buffer layer 51. Therefore, controllability for the threshold voltage is improved on the basis of the same principle as that of the first embodiment. Since $In_{0.1}Al_{0.47}Ga_{0.43}N$ has a band gap of 4.56 eV which is larger than that (3.09 eV) of $In_{0.2}Ga_{0.8}N$ forming the channel layer, it forms a good gate insulating layer. These characteristics are apparent also since inequalities (5) and (8) are established when x=0.1, y=0.47, and z=0.2.

In the seventh embodiment, since the channel layer is formed of n-type InGaN, the effective electron mass in the channel layer through which the electrons travel is decreased, and the electron mobility is increased to have better the high-frequency characteristics than those of the fifth embodiment.

Eighth Embodiment

Figure 9:
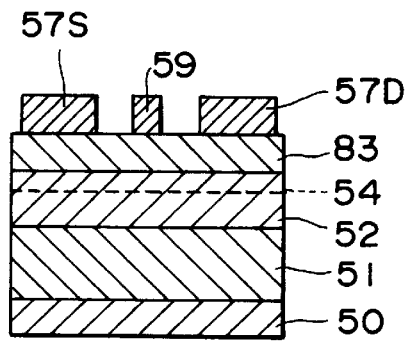
FIG. 9 is a sectional view showing a structure concerning an HJFET according to the eighth embodiment of the present invention.

FIG. 9 is a sectional view showing a structure according to the eighth embodiment of the present invention. This HJFET structure is different from that of the fifth embodiment in that it uses, as a gate insulating layer 83, a superlattice layer obtained by stacking a 30 Å thick undoped $In_{0.2}Ga_{0.8}N$ layer and a 30 Å thick $Al_{0.94}Ga_{0.06}N$ layer seven times.

The $In_{0.2}Ga_{0.8}N/Al_{0.94}Ga_{0.06}N$ superlattice layer forming the gate insulating layer operates substantially in the same manner as four-element mixed crystal type $In_{0.1}Al_{0.47}Ga_{0.43}N$. Therefore, this superlattice structure is lattice-matched with GaN forming the buffer layer 51 on the basis of the same principle as that of the fifth embodiment.

In the eighth embodiment, the gate insulating layer is formed of the undoped InGaN/AlGaN superlattice layer. Since the gate insulating layer can be formed of a three-element type semiconductor material, a high-quality epitaxial layer can be formed more easily than in the fifth embodiment using a four-element type semiconductor material the mixed crystal ratio of which is difficult to control.

In the eighth embodiment, an InGaN/AlGaN superlattice structure is used in place of an InAlGaN layer. The same function as that of the eighth embodiment can also be realized by using a superlattice structure having another combination, e.g., an InGaN/InAlN superlattice structure or InAlN/AlGaN superlattice structure.

The present invention has been described by way of the above embodiments. The present invention is not limited to the modes described in the respective embodiments but naturally includes various other modes according to the principle of the present invention.

What is claimed is:

1. A heterojunction field effect transistor having a buffer layer comprising at least one GaN layer, a channel layer, a gate insulating layer, a source electrode, a drain electrode, and a gate electrode, to be in contact with a substrate, wherein said channel layer has a composition of $In_zGa_{1-z}N$ ($0 \leq z<1$) and said gate insulating layer is an $In_xAl_yGa_{1-x-y}N$ layer, wherein y is less than approximately 4.66x, and said source and drain electrodes are in ohmic contact with said channel layer and said gate electrode and said gate insulating layer are in Schottky contact with each other.

2. A heterojunction field effect transistor having a buffer layer comprising at least one GaN layer, a channel layer, a gate insulating layer, a source electrode, a drain electrode, and a gate electrode, to be in contact with a substrate, wherein said channel layer has a composition of $In_zGa_{1-z}N$ ($0 \leq z<1$) and said gate insulating layer is an InAlGaN layer, and said source and drain electrodes are in ohmic contact with said channel layer and said gate electrode and said gate insulating layer are in Schottky contact with each other, wherein the composition of said InAlGaN layer is expressed by $In_xAl_yGa_{1-x-y}N$ (x>0, y>0, x+y$\leq$1) and a composition ratio of x to y satisfies an inequality of $|y-4.66x|<1$.

3. A heterojunction field effect transistor having a buffer layer comprising at least one GaN layer, a channel layer, a gate insulating layer, a source electrode, a drain electrode, and a gate electrode, to be in contact with a substrate, wherein said channel layer has a composition of $In_zGa_{1-z}N$ ($0 \leq z<1$) and said gate insulating layer is an InAlGaN layer, and said source and drain electrodes are in ohmic contact with said channel layer and said gate electrode and said gate insulating layer are in Schottky contact with each other, wherein the composition of said InAlGaN layer is expressed by $In_xAl_yGa_{1-x-y}N$ (x>0, y>0, x+y$\leq$1) and a composition ratio of x to y satisfies an inequality of $|y-4.66x|<0.05$.

4. A transistor according to claim 2, wherein a composition ratio of x to y of said InAlGaN layer satisfies an inequality of $y > 0.533(x-z)$.

5. A transistor according to claim 3, wherein a composition ratio of x to y of said InAlGaN layer satisfies an inequality of $y > 0.533(x-z)$.

6. A transistor according to claim 1, wherein said InAlGaN layer has a superlattice structure made of a multilayered structure of an $In_T Ga_{1-T}N$ layer ($0<T<1$) and an $Al_S Ga_{1-S}N$ layer ($0<S<1$).

7. A transistor according to claim 1, wherein said InAlGaN layer has a superlattice structure made of a multilayered structure of an $In_{1-T} Ga_T N$ layer ($0<T<1$) and an $In_{1-S} Al_S N$ layer ($0<S<1$).

8. A transistor according to claim 1, wherein said InAlGaN layer has a superlattice structure made of a multilayered structure of an $In_T Al_{1-T}N$ layer ($0<T<1$) and an $Al_{1-S} Ga_S N$ layer ($0<S<1$).

9. A transistor according to claim 1, wherein said InAlGaN layer is doped with an impurity.

10. A transistor according to claim 2, wherein said InAlGaN layer is doped with an impurity.

11. A transistor according to claim 3, wherein said InAlGaN layer is doped with an impurity.

12. A transistor according to claim 4, wherein said InAlGaN layer is doped with an impurity.

13. A transistor according to claim 2, wherein said InAlGaN layer has a superlattice structure made of a multilayered structure of an $In_T Ga_{1-T}N$ layer ($0<T<1$) and an $Al_S Ga_{1-S}N$ layer ($0<S<1$).

14. A transistor according to claim 2, wherein said InAlGaN layer has a superlattice structure made of a multilayered structure of an $In_{1-T} Ga_T N$ layer ($0<T<1$) and an $In_{1-S} Al_S N$ layer ($0<S<1$).

15. A transistor according to claim 2, wherein said InAlGaN layer has a superlattice structure made of a multilayered structure of an $In_T Al_{1-T}N$ layer ($0<T<1$) and an $Al_{1-S} Ga_S N$ layer ($0<S<1$).

16. A transistor according to claim 3, wherein said InAlGaN layer has a superlattice structure made of a multilayered structure of an $In_T Ga_{1-T}N$ layer ($0<T<1$) and an $Al_S Ga_{1-S}N$ layer ($0<S<1$).

17. A transistor according to claim 3, wherein said InAlGaN layer has a superlattice structure made of a multilayered structure of an $In_{1-T} Ga_T N$ layer ($0<T<1$) and an $In_{1-S} Al_S N$ layer ($0<S<1$).

18. A transistor according to claim 3, wherein said InAlGaN layer has a superlattice structure made of a multilayered structure of an $In_T Al_{1-T}N$ layer ($0T<1$) and an $Al_{1-S} Ga_S N$ layer ($0<S<1$).

* * * * *